United States Patent
Taguchi et al.

(10) Patent No.: US 10,948,816 B2
(45) Date of Patent: Mar. 16, 2021

(54) PELLICLE FRAME AND PELLICLE

(71) Applicant: NIPPON LIGHT METAL COMPANY, LTD., Tokyo (JP)

(72) Inventors: Yoshihiro Taguchi, Shizuoka (JP); Takayuki Yamaguchi, Shizuoka (JP); Jun Yu, Shizuoka (JP); Yasuo Ishiwata, Shizuoka (JP)

(73) Assignee: NIPPON LIGHT METAL COMPANY, LTD., Tokyo (JP)

( * ) Notice: Subject to any disclaimer, the term of this patent is extended or adjusted under 35 U.S.C. 154(b) by 275 days.

(21) Appl. No.: 16/316,537

(22) PCT Filed: Jun. 30, 2017

(86) PCT No.: PCT/JP2017/024177
§ 371 (c)(1),
(2) Date: Jan. 9, 2019

(87) PCT Pub. No.: WO2018/012324
PCT Pub. Date: Jan. 18, 2018

(65) Prior Publication Data
US 2019/0302607 A1    Oct. 3, 2019

(30) Foreign Application Priority Data
Jul. 12, 2016   (JP) .................. 2016-137523

(51) Int. Cl.
*G03F 1/64* (2012.01)
(52) U.S. Cl.
CPC ..................... *G03F 1/64* (2013.01)

(58) Field of Classification Search
CPC .................. G03F 1/62; G03F 1/64
USPC .......................................... 430/5
See application file for complete search history.

(56) References Cited

FOREIGN PATENT DOCUMENTS

| JP | 2001-279359 A | 10/2001 |
| JP | 2011-7934 A | 1/2011 |
| JP | 2011-105982 A | 6/2011 |
| WO | 2015/059783 A1 | 4/2015 |

OTHER PUBLICATIONS

International Preliminary Report on Patentability dated Feb. 12, 2019 filed in PCT/JP2017/024177.
Extended European Search Report (EESR) dated Feb. 6, 2020 issued in European Patent Application No. 17827454.4.

*Primary Examiner* — Christopher G Young
(74) *Attorney, Agent, or Firm* — Rankin, Hill & Clark LLP

(57) ABSTRACT

The present invention provides a pellicle frame which can effectively inhibit deformation of an exposure master plate (8) caused by affixing the pellicle (1), and which does not have a complex shape, and a pellicle which uses said pellicle frame are provided. The pellicle frame with an anodized film on a surface of an aluminum alloy frame is characterized in that: the aluminum alloy frame comprises an aluminum alloy which contains Ca: 5.0 to 10.0% by weight with the remainder aluminum and unavoidable impurities are contained, and has an area (volume) ratio of an $Al_4Ca$ phase, which is a dispersed phase, is greater than or equal to 25%, and a crystal structure of a part of the $Al_4Ca$ phase is monoclinic; wherein the anodized film contains $Al_4Ca$ particles.

8 Claims, 4 Drawing Sheets

[FIG. 1]
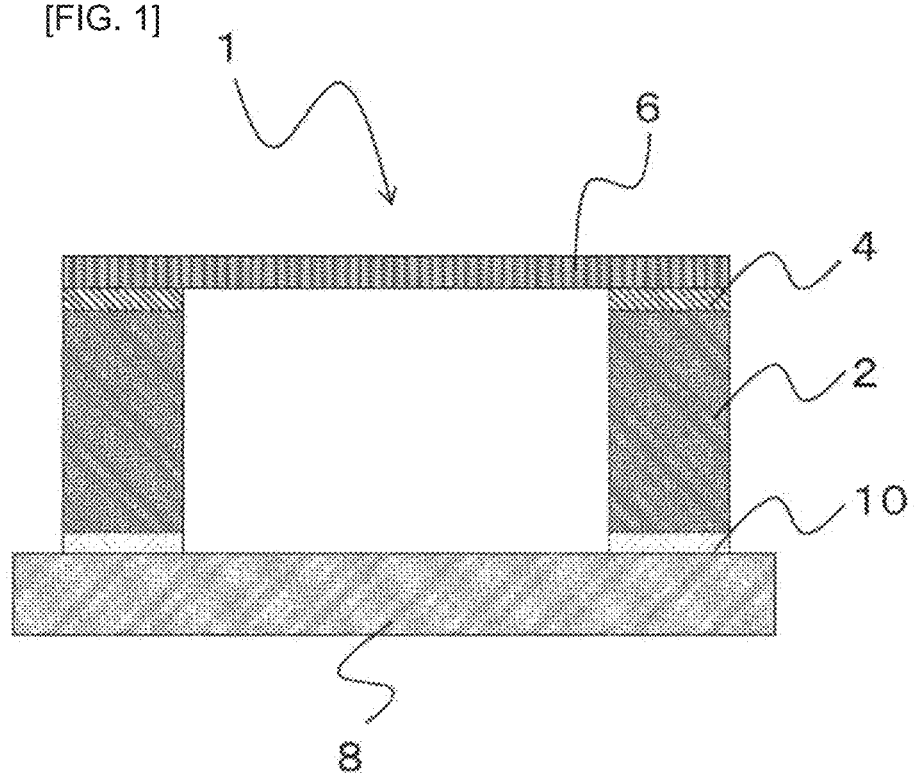
[FIG. 2]
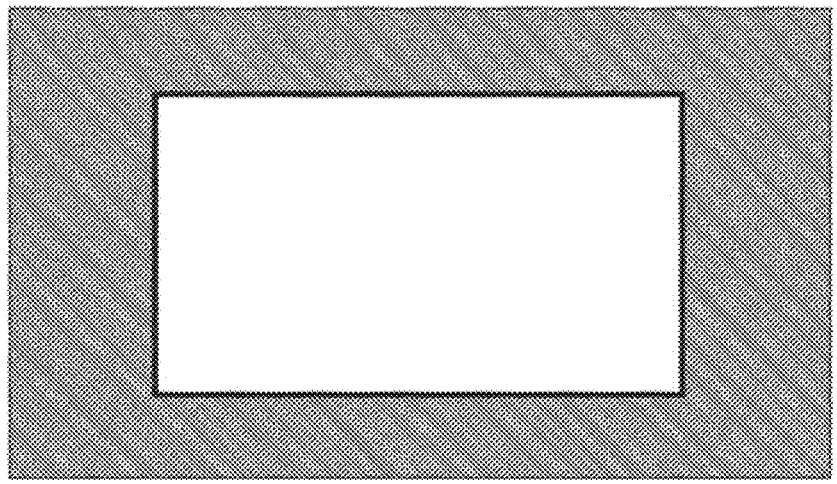
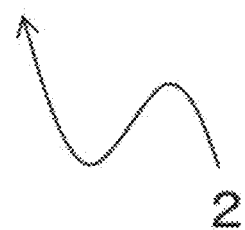

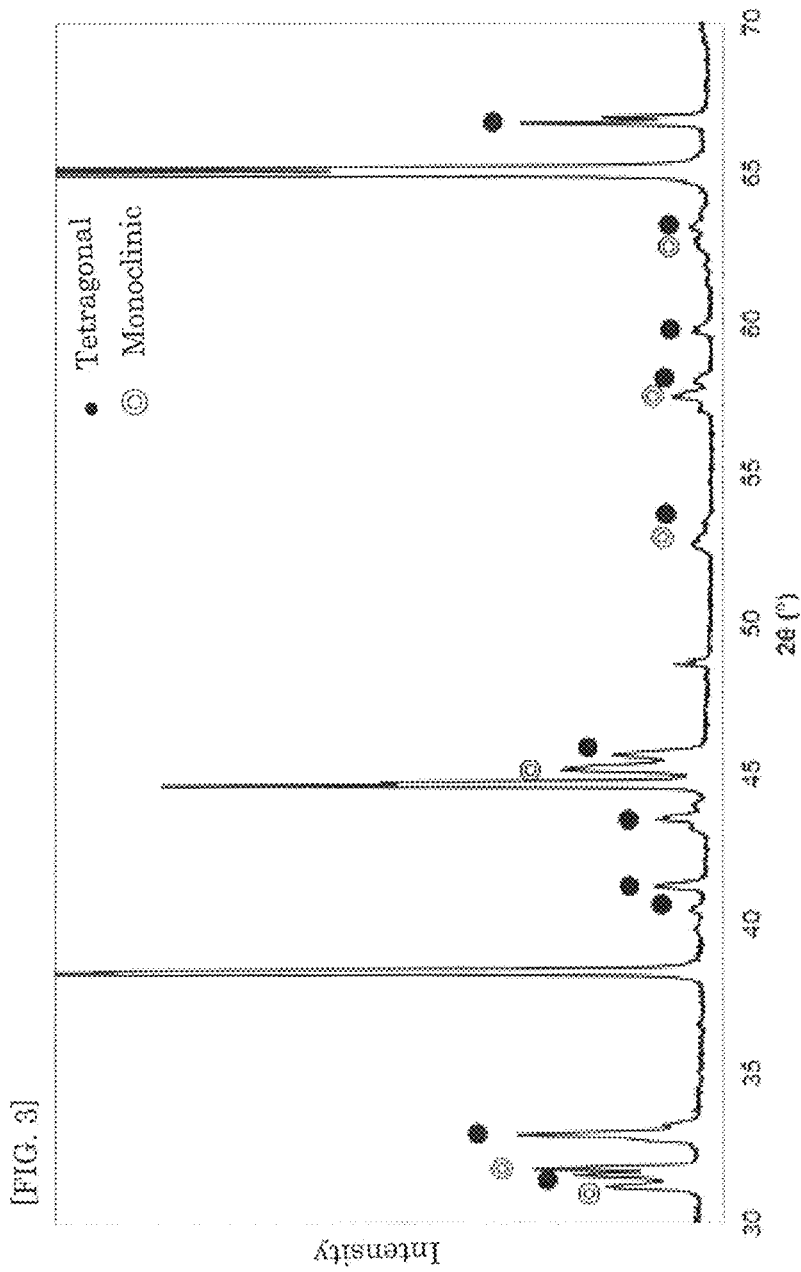
[FIG. 3]

[FIG. 4]
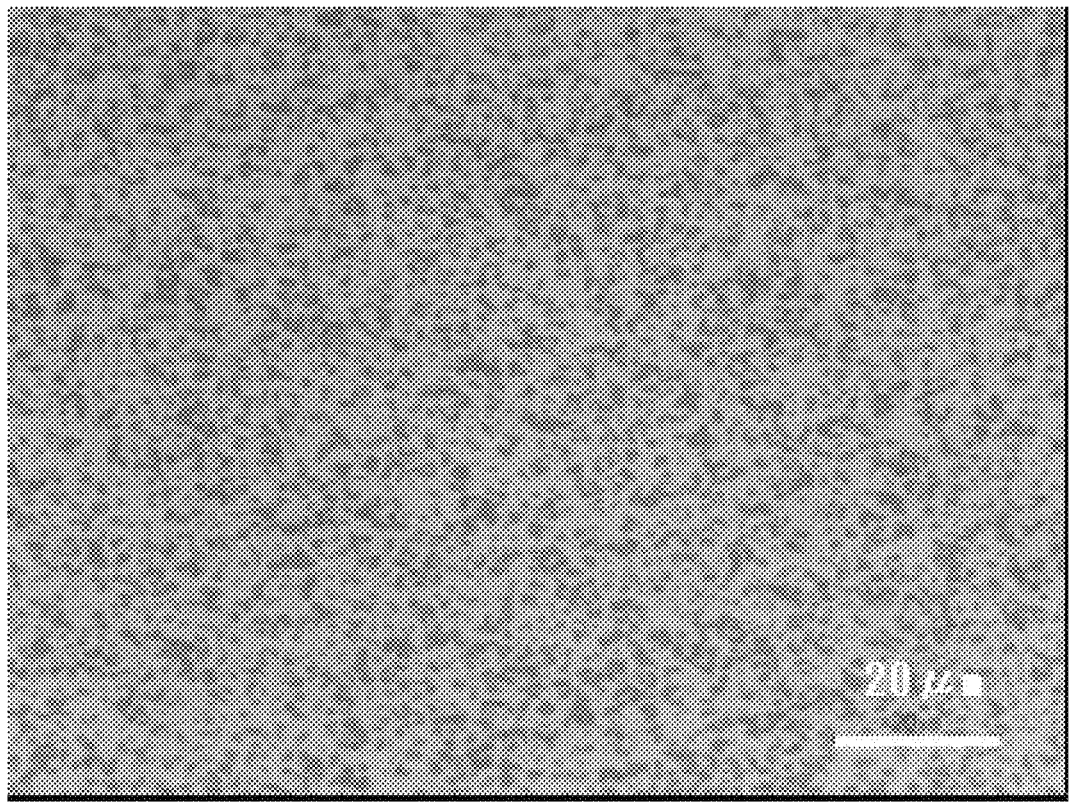

[FIG. 5]
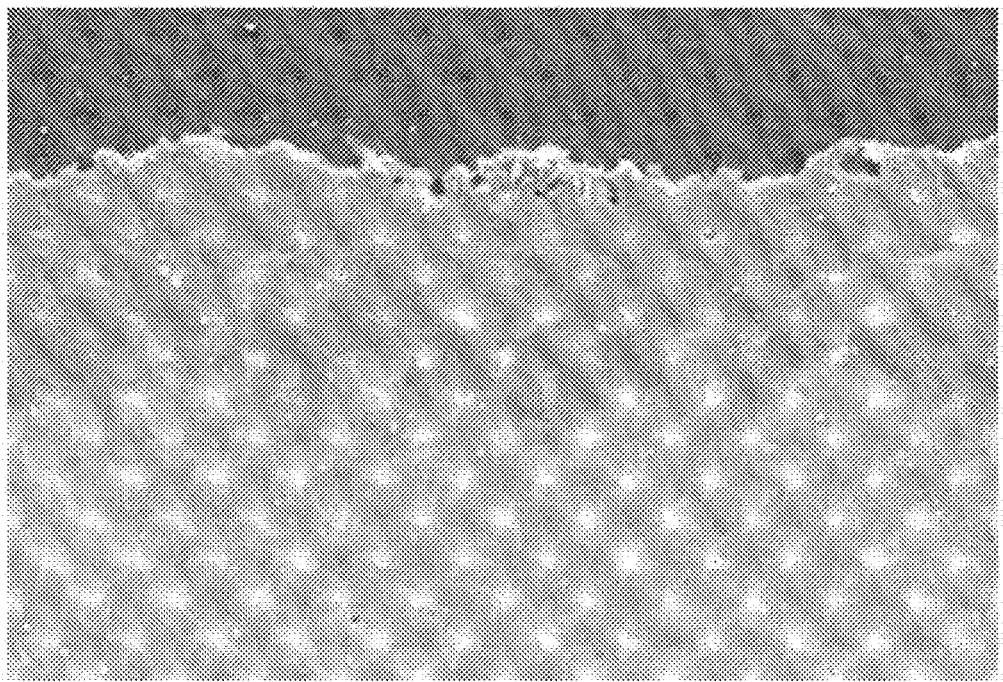
1μm
[FIG. 6]
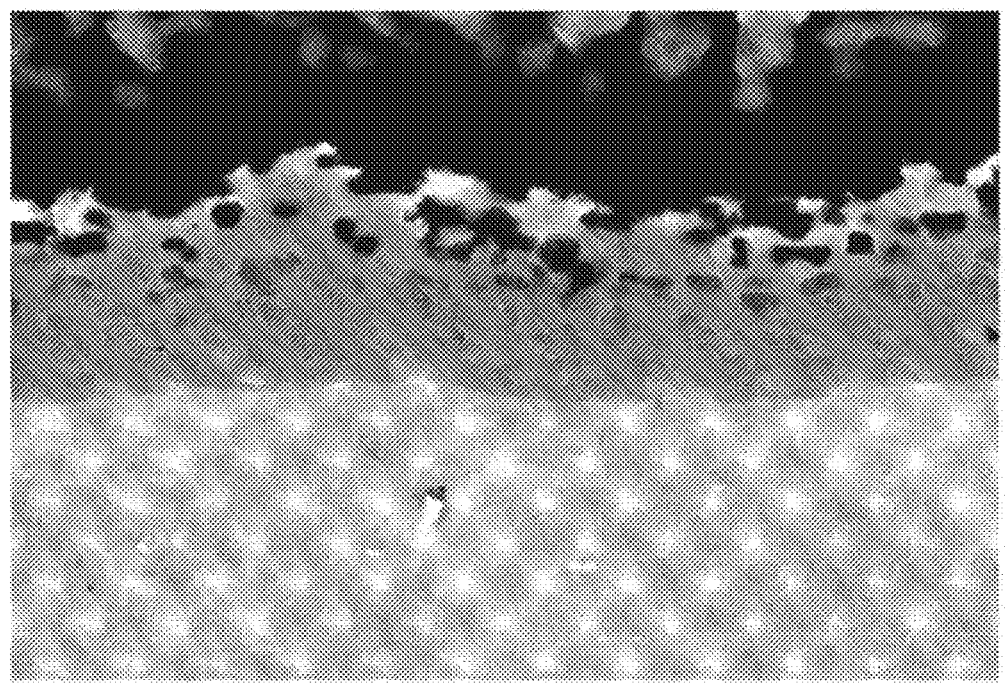
1μm pattern from dust. When the pellicle is affixed to the exposure master plate, there is a case that the flatness of the exposure master plate may be changed, and there rises a problem that defocusing may occur due to the decrease in the flatness of the exposure master plate. When the flatness of the exposure master plate is changed, the figure of the pattern drawn on the exposure master plate is changed, and overlay accuracy of the exposure master plate is reduced. Here, it is known that the change in the flatness of the exposure master plate by the affix of the pellicle is greatly influenced by the flatness of the pellicle frame.

PELLICLE FRAME AND PELLICLE

FIELD OF THE INVENTION

The present invention relates to a frame used for a pellicle of a lithography mask used for manufacturing a liquid crystal display panel for manufacturing a semiconductor device such as an LSI and a liquid crystal display panel, more specifically, relates to a pellicle frame which can be suitably used even in exposure requiring high resolution, and a pellicle using the pellicle frame.

On a semiconductor device such as an LSI and an ultra LSI and a liquid crystal display panel, a pattern can be formed by irradiating a light to a semiconductor wafer or an original plate for liquid crystal (pattern formation by lithography). Here, in the case of using an exposure master plate to which dust adheres, since the dust absorbs and/or inverts the light, the pattern is not transferred satisfactorily (for example, deformation of the pattern or ambiguity of the edge). As a result, the quality and appearance of the semiconductor device and the liquid crystal display panel are impaired, which results in a decrease in performance and manufacturing yield.

For this reason, the lithography process is usually performed in a clean room, but, since adhesion of dust to the exposure master plate cannot be completely prevented even under such environment, usually a pellicle for protecting from dust is provided on the surface of the exposure master plate. Pellicle is composed of a pellicle frame and a pellicle film stretched over the pellicle frame and is placed so as to surround a pattern area formed on the surface of the exposure master plate. When the focal point is set on the pattern of the exposure master plate at the time of lithography, even if dust adheres to the pellicle film, the dust will not affect the transfer. Success Recently, the pattern of the LSI has been rapidly advanced to fineness, and accordingly, a wavelength of the exposure light source has been shortened. Specifically, the wavelength has transited from g-line (436 nm) and i-line (365 nm) of a mercury lamp to KrF excimer laser (248 nm), ArF excimer laser (193 nm) and the like, and thus the flatness required for the exposure master plate and a silicon wafer has become more severe.

After the exposure master plate is completed, the pellicle is affixed to the exposure master plate for protection of the pattern from dust. When the pellicle is affixed to the exposure master plate, there is a case that the flatness of the exposure master plate may be changed, and there rises a problem that defocusing may occur due to the decrease in the flatness of the exposure master plate. When the flatness of the exposure master plate is changed, the figure of the pattern drawn on the exposure master plate is changed, and overlay accuracy of the exposure master plate is reduced. Here, it is known that the change in the flatness of the exposure master plate by the affix of the pellicle is greatly influenced by the flatness of the pellicle frame.

On the other hand, for example, in Patent Literature 1 (JP 2011-7934 A), there is disclosed a pellicle frame that a cross section of the pellicle frame bar has a shape having a quadrangular depression on both sides of a basic quadrilateral in which the upper side and the lower side are parallel.

In the pellicle frame described in the above Patent Literature 1, it is possible to form a pellicle frame having a small deformation stress by reducing the cross-sectional area of the pellicle frame compared to the basic quadrilateral. Therefore, even if the pellicle is affixed to the exposure master plate, the deformation of the exposure master plate caused by the deformation of the pellicle frame can be reduced as much as possible.

CITATION LIST

Patent Literature

Patent Literature 1: JP 2011-7934 A

SUMMARY OF INVENTION

Technical Problem

However, in the pellicle frame described in Patent Literature 1, it is necessary to process for forming the depression on the quadrilateral, which makes not only complicating the manufacturing process, but also being disadvantageous in terms of cost. In addition, the flatness of the pellicle frame is still insufficient.

Considering the above problems in the prior arts, an object of the present invention is to provide a pellicle frame which can effectively inhibit distortion of the photomask caused by mounting the pellicle, and which does not have a complex shape, and a pellicle which uses said pellicle frame are provided.

Solution to Problem

As a result of extensive study with respect to the materials and the like for a pellicle frame in order to achieve the above object, the present inventors have found that utilization of an Al—Ca alloy is extremely effective in improvement of the flatness of the pellicle frame, the present invention has been completed.

Namely, the present invention is to provide a pellicle frame with an anodized film on a surface of an aluminum alloy frame, characterized in that: the aluminum alloy frame comprises an aluminum alloy which contains Ca: 5.0 to 10.0% by weight with the remainder aluminum and unavoidable impurities are contained, and has an area (volume) ratio of an $Al_4Ca$ phase, which is a dispersed phase, is greater than or equal to 25%, and a crystal structure of a part of the $Al_4Ca$ phase is monoclinic; wherein the anodized film contains $Al_4Ca$ particles.

In order to improve the flatness, a pellicle frame is required to have a low Young's modulus. By using an Al—Ca alloy having a Young's modulus lower than a general aluminum alloy, it is possible to obtain both of a low Young's modulus and a mechanical strength required for the pellicle frame. That is, by using an Al—Ca alloy having a low Young's modulus as the material of the pellicle frame, the deformation of the exposure master plate can be effectively inhibited even if the pellicle frame does not have a complicated shape. Though such materials having a low Young's modulus include magnesium, synthetic resins, and the like, from the viewpoints of material availability and versatility, it is preferable to use Al—Ca alloy which is an aluminum alloy.

The Al—Ca alloy is not particularly limited as long as the effect of the present invention is not impaired, and various conventionally known Al—Ca alloys can be used, but it is necessary that the alloy has Ca: 5.0 to 10.0% by weight with the remainder aluminum and unavoidable impurities, the area (volume) ratio of the $Al_4Ca$ phase which is the dispersed phase is greater than or equal to 25%, and the crystal structure of a part of the $Al_4Ca$ phase is formed from an aluminum alloy which is monoclinic. In the present invention, the area (volume) ratio of the $Al_4Ca$ phase can be easily measured by image analysis of the cross-sectional observation image by an optical microscope, for example.

By adding Ca, $Al_4Ca$ can be prepared, and the effect of lowering the Young's modulus of the aluminum alloy can be achieved. The effect becomes remarkable when the content of Ca is greater than or equal to 5.0%. Conversely, when added in excess of 10.0%, the castability decreases, particularly casting by continuous casting such as DC casting becomes difficult, and thus it is necessary to manufacture by a method with high production cost such as a powder metallurgy method. In the case of manufacturing by a powder metallurgy method, oxides formed on the surface of the alloy powder may get mixed in the product, which may lower the yield strength.

The crystal structure of the $Al_4Ca$ phase used as the disperse phase is basically tetragonal. However, as the present inventors' extensive study, it was found that when the $Al_4Ca$ phase has monoclinic crystal structure, the yield strength is not so decreased but the Young's modulus decreased greatly. Here, by setting the volume ratio of the $Al_4Ca$ phase to greater than or equal to 25%, the Young's modulus can be greatly decreased while maintaining the yield strength as it is. The presence or absence of the $Al_4Ca$ phase and the crystal structure can be evaluated by, for example, an X-ray diffraction measurement method.

Distortion of the exposure master plate by affixing the pellicle to the exposure master plate is greatly affected by distortion of the pellicle frame. At the time of affixing, the pellicle frame deforms, and the exposure master plate is deformed by the deformation stress caused by get back to the original. Since the deformation stress depends on the Young's modulus of the material constituting the pellicle frame and the deformation amount thereof, by using an Al—Ca alloy having a low Young's modulus, when the pellicle is affixed to the exposure master plate, it is possible to realize a pellicle frame having a small deformation stress.

In the pellicle frame of the present invention, it is preferable that a V content and a Fe content of the aluminum alloy are 0.0001 to 0.005% by weight and 0.05 to 1.0% by weight, respectively. When V is present in the Al—Ca alloy in an amount of around 1%, a compound having a size of 30 μm or more is formed with Ca, Ti, Al or the like, and white spot defects sometimes become apparent after the anodizing treatment. On the other hand, by inhibiting the V content within the range of 0.0001 to 0.005% by weight, it is possible to inhibit the white spot defects.

Also, when casting the Al—Ca alloy, there is a case that a fine eutectic structure may be formed in the vicinity of the a phase (Al phase), and after subjecting the Al—Ca alloy having the fine eutectic structure to plastic working, when applying the anodizing treatment, the portion corresponding to the fine eutectic texture is emphasized in black due to the difference in the structure, which results in a black defect. On the other hand, the Al—Ca alloy to which 0.05 to 1.0% by weight of Fe is added is made coarse and has a homogeneous cast structure to make the fine eutectic is blurred, so that it can be prevented from becoming black defects.

Further, in the pellicle frame of the present invention, the average crystal grain size of the $Al_4Ca$ phase is preferably smaller than or equal to 1.5 μm. By dispersing finer $Al_4Ca$ phases, it is possible to promote the blackening after the anodizing treatment.

In the pellicle frame of the present invention, it is preferable that the Al—Ca alloy is processed by a plastic working, particularly as a hot rolled material. Since the hot rolled Al—Ca alloy material has both the low Young's modulus and the mechanical strength required for the pellicle frame, it can be suitably used as a material of a pellicle frame. The Al—Ca alloy powder material produced by an atomization method is sandwiched between two pieces of aluminum plates serving as skin members, subjected to hot rolling, and the resultant plate material is framed by mechanical work, whereby the hot rolled material can be obtained.

Further, in the pellicle frame of the present invention, it is preferable that the Al—Ca alloy is produced by a die casting method. Since the Al—Ca alloy material produced by the die casting has both the low Young's modulus and the mechanical strength required for the pellicle frame, it can be suitably used as a material of a pellicle frame. Further, by manufacturing an Al—Ca alloy material for a pellicle frame by the die casting, mechanical works can be reduced, and the Al—Ca alloy material having a low Young's modulus and a high strength can be efficiently obtained.

Furthermore, in the pellicle frame of the present invention, it is preferable that Zn, Mg and Cu are added to the Al—Ca alloy. In order to prevent the reflection of the light from the light source and to obtain a clear pattern transferred image, it is required a blackening of the pellicle frame by using an anodizing treatment or the like, and when Zn, Mg and Cu are added to the Al—Ca alloy, the blackening becomes easy.

Here, in the pellicle frame of the present invention, since the $Al_4Ca$ phase (particles) remains in the anodized film and there are no voids or the like caused by desorption of the $Al_4Ca$ phase (particles), it is possible to obtain a uniform film from the viewpoint of color and mechanical properties.

Further, the present invention is to provide a method for manufacturing a pellicle frame, comprising:

a first step for obtaining an aluminum alloy plastic worked by subjecting an aluminum alloy ingot which contains 5.0 to 10.0% by weight of Ca with the remainder aluminum and inevitable impurities, and has a volume ratio of an $Al_4Ca$ phase which is a dispersed phase of 25% or more to a plastic working, a second step for subjecting the aluminum alloy plastic worked to a heat treatment in a temperature range of 100 to 300° C., and a third step for subjecting the heat-treated aluminum alloy plastic worked to an anodizing treatment with an alkaline electrolytic solution containing an alkali metal and/or an alkaline earth metal as an electrolyte, or an alkaline electrolytic solution containing at least one organic acid selected from maleic acid, oxalic acid, salicylic acid and citric acid.

A Young's modulus of the Al—Ca alloy varies depending on the amount of the $Al_4Ca$ phase and the crystal structure. Therefore, even if the amount of the $Al_4Ca$ phase is the same, the crystal structure is changed by the plastic working in the first step, and the Young's modulus may be increased in some cases. On the other hand, by subjecting to the heat treatment (annealing treatment) in the temperature range of 100 to 300° C. after the plastic working, it is possible to return the crystal structure of the $Al_4Ca$ phase to the state before the plastic working, and further to lower the Young's modulus. Therefore, even if the second step and the third step are exchanged, the same effect can be obtained, but in that case, it is necessary to consider the damage (crack etc.) to the film by heat treatment.

In the manufacturing method of the pellicle frame of the present invention, it is preferable that the V content and the Fe content of the aluminum alloy ingot are set to 0.0001 to 0.005% by weight and 0.05 to 1.0% by weight, respectively.

By setting the V content of the aluminum alloy ingot to 0.0001 to 0.005% by weight, it is possible to inhibit the formation of a compound of greater than or equal to 30 μm by reaction with V and Ca, Ti, Al and the like. As a result, the formation of the white spot defects can be inhibited after the anodization treatment (third step).

Further, by setting the Fe content to 0.05 to 1.0% by weight, the cast structure of the Al—Ca alloy can be made coarse and uniform. As a result, the fine eutectic structure emphasized after the anodization treatment (third step) can be blurred, and the formation of the black defects can be inhibited.

In the manufacturing method of the pellicle frame of the present invention, it is preferable to achieve the heat treatment to maintain the aluminum alloy ingot at a temperature of higher than or equal to 400° C. before the first step. By holding (homogenizing treatment) at a temperature of higher than or equal to 400° C. prior to the plastic working, the eutectic structure can be made coarse and uniform. As a result, as mentioned above, the fine eutectic structure can be blurred, and the formation of the black spot defects can be inhibited.

In the method for manufacturing the pellicle frame of the present invention, it is preferable that, after the third step, a secondary electrolytic coloring is further achieved with an electrolytic solution containing a metal salt. For example, the secondary electrolysis with an electrolytic coloring solution containing a Ni salt, a Ni+Sn salt or the like makes it possible to further advance blackening and also to reduce white spot and black spot defects.

The present invention also provides
a pellicle having the pellicle frame of the present invention and
a pellicle film supported by the pellicle frame.

Since the pellicle frame of the present invention achieves both the mechanical strength and the low Young's modulus required for the pellicle frame, the pellicle of the present invention can maintain extremely good flatness.

Effects of the Invention

According to the present invention, it is possible to provide a pellicle frame which can effectively inhibit distortion of the photomask caused by mounting the pellicle, and which does not have a complex shape. Further, according to the present invention, it is possible to provide a pellicle having extremely good flatness.

BRIEF DESCRIPTION OF THE DRAWINGS

FIG. 1 is a schematic cross-sectional view showing one example of the pellicle of the present invention configured using the pellicle frame of the present invention.

FIG. 2 is a schematic plan view showing one example of the pellicle frame of the present invention.

FIG. 3 is an X-ray diffraction pattern of the aluminum alloy plastic worked obtained in Example.

FIG. 4 is an optical microscopic photograph of the cross section of the pellicle frame of Example.

FIG. 5 is a SEM photograph of the cross section relating to the pellicle frame of Example.

FIG. 6 is a SEM photograph of the cross section relating to the pellicle frame of Comparative Example 2.

EMBODIMENTS FOR ACHIEVING THE INVENTION

Hereinafter, representative embodiments of the pellicle frame and the pellicle of the present invention will be described in detail with reference to the drawings, but the present invention is not limited to only these examples. In the following description, the same or equivalent parts are denoted by the same numerals, and there is a case that redundant explanation may be omitted. In addition, since the drawings are for conceptually explaining the present invention, dimensions of the respective constituent elements expressed and ratios thereof may be different from actual ones.

1. Pellicle Frame and Pellicle

The pellicle frame of the present invention is a pellicle frame characterized by being made of an Al—Ca alloy, and by stretching and affixing a pellicle film on one end surface of the pellicle frame via an adhesive for pellicle film, it is possible to use as a pellicle frame for lithography.

A schematic sectional view of one example of the pellicle of the present invention constituted by using the pellicle frame of the present invention and a schematic plan view of the pellicle frame of the present invention are shown in FIG. 1 and FIG. 2, respectively. The pellicle 1 is obtained by stretching and affixing a pellicle film 6 on the upper end surface of a pellicle frame 2 via an adhesive layer 4 for affixing the pellicle film. When using the pellicle 1, a pressure sensitive adhesive layer 10 for adhering the pellicle 1 to the exposure master plate (mask or reticle) 8 is formed on the lower end surface of the pellicle frame 2, and a liner (not shown) is peelably adhered to the lower end surface of the pressure sensitive adhesive layer 10.

It is preferable that the pellicle frame 2 is made of an Al—Ca alloy, and the Al—Ca alloy is processed as a hot extruded material or a hot rolled material, or manufactured by a die casting method. By using these methods, it is possible to efficiently obtain an Al—Ca alloy having both the low Young's modulus and the mechanical strength required for the pellicle frame. The process steps of the hot extrusion, hot rolling, and die casting are not particularly limited as long as the effects of the present invention are not impaired, and various conventionally known methods can be used.

The Al—Ca alloy is not particularly limited as long as the effect of the present invention is not impaired, and various conventionally known Al—Ca alloys can be used, but it is necessary that the alloy has Ca: 5.0 to 10.0% by weight with the remainder aluminum and unavoidable impurities, the area (volume) ratio of the $Al_4Ca$ phase which is the dispersed phase is greater than or equal to 25%, and the crystal structure of a part of the $Al_4Ca$ phase is monoclinic.

By adding Ca, a compound of $Al_4Ca$ can be prepared, and the effect of lowering the Young's modulus of the aluminum alloy can be achieved. The effect becomes remarkable when the content of Ca is greater than or equal to 5.0%. Conversely, when added in excess of 10.0%, the castability decreases, particularly casting by continuous casting such as DC casting becomes difficult, and thus it is necessary to manufacture by a method with high production cost such as a powder metallurgy method. In the case of manufacturing by a powder metallurgy method, oxides formed on the surface of the alloy powder may get mixed in the product, which may lower the yield strength.

The crystal structure of the $Al_4Ca$ phase used as the disperse phase is basically tetragonal. However, as the present inventors' extensive study, it was found that when the $Al_4Ca$ phase has monoclinic crystal structure, the yield strength is not so decreased but the Young's modulus decreased greatly. Here, by setting the volume ratio of the Al$_4$Ca phase to greater than or equal to 25%, the Young's modulus can be greatly decreased while maintaining the yield strength as it is.

It is preferable that the Al—Ca alloy contains a V content and a Fe content of the aluminum alloy are 0.0001 to 0.005% by weight and 0.05 to 1.0% by weight, respectively. When V is present in the Al—Ca alloy in an amount of around 1%, a compound having a size of 30 μm or more is formed with Ca, Ti, Al or the like, and white spot defects sometimes become apparent after the anodizing treatment. On the other hand, by inhibiting the V content within the range of 0.0001 to 0.005% by weight, it is possible to inhibit the white spot defects.

Also, when casting the Al—Ca alloy, there is a case that a fine eutectic structure may be formed in the vicinity of the a phase (Al phase), and after subjecting the Al—Ca alloy having the fine eutectic structure to plastic working, when applying the anodizing treatment, the portion corresponding to the fine eutectic texture is emphasized in black due to the difference in the structure, which results in a black defect. On the other hand, the Al—Ca alloy to which 0.05 to 1.0% by weight of Fe is added is made coarse and has a homogeneous cast structure to make the fine eutectic is blurred, so that it can be prevented from becoming black defects.

Further, the average crystal grain size of the Al$_4$Ca phase is preferably smaller than or equal to 1.5 μm. By dispersing finer Al$_4$Ca phases, it is possible to promote the blackening after the anodizing treatment.

A powder sintered material may also be used for the above Al—Ca alloy. In order to improve the flatness of the exposure master plate (mask or reticle) 8 after adhering the pellicle 1, the pellicle frame 2 having a low Young's modulus is required. Comparing with general aluminum alloys, the Al—Ca alloy has a low Young's modulus, and in addition thereto, a Young's modulus thereof can be set to a lower value by using the powder sintered material having voids.

The Al—Ca alloy is not particularly limited as long as the effects of the present invention are not impaired, and various conventionally known Al—Ca alloys can be used, but, according to the crystal structure, shape control, and the like of the Al$_4$Ca crystal, it is preferable to use an Al—Ca alloy that achieves both the low Young's modulus and the excellent rolling processability.

As described above, the distortion of the exposure master plate (mask or reticle) 8 by affixing the pellicle 1 to the exposure master plate (mask or reticle) 8 is greatly affected by the distortion of the pellicle frame 2. At the time of the affixing, the pellicle frame 2 is deformed, and the exposure master plate (mask or reticle) 8 is deformed by the deformation stress that tries to back to the original shape. Since the deformation stress depends on the Young's modulus of the material constituting the pellicle frame 2 and the deformation amount thereof, by using an Al—Ca alloy having a low Young's modulus, it is possible to realize the pellicle frame 2 having a small deformation stress when affixes the pellicle 1 to the exposure master plate (mask or reticle) 8.

As the material of the pellicle frame 2, for example, it is possible to use a material which is obtained by processing the powder sintered body of the Al—Ca alloy as a hot extruded material. When achieving the hot processing such as hot forging or hot extrusion of the Al—Ca alloy powder material, though defects such as blister may be generated in some cases, by hot-extruding the Al—Ca alloy powder sintered body, it is possible to obtain a material in which occurrence of the defect is inhibited.

The method for preparing the hot extruded Al—Ca alloy powder material used as the material of the pellicle frame 2 is not particularly limited, but it is preferably prepared by molding a raw material powder through a CIP method or the like (for example, Al—Ca alloy powder prepared by a quenched solidification method such as an atomizing method, a mechanical alloying method, or the like), heating and sintering the Al—Ca alloy powder molded body in vacuum or in an inert gas atmosphere, cooling the sintered body in vacuum or in an inert gas atmosphere, and hot-extruding the obtained sintered body. Here, the porosity of the hot extruded Al—Ca alloy powder material can be appropriately controlled depending on the compacting condition, the sintering condition, the extrusion condition, the oxidation state of the surface of the raw powder material, and the like.

Further, in the material of the pellicle frame 2, it is preferable that the Ca content of the Al—Ca alloy is 0.5 to 15% by mass. When the Ca content is greater than or equal to 0.5% by mass, an Al$_4$Ca phase is properly formed, and the Young's modulus can be effectively reduced. In addition, when the Ca content is smaller than or equal to 15% by mass, the amount of Al$_4$Ca phase does not become too large, and it is possible to inhibit that the material becomes brittle, which results in giving the sufficient strength.

In order to form a uniform anodized film, an etching treatment using an acid or an alkali may be achieved as a pretreatment, and in order to facilitate detection when dust or the like adheres to the obtained frame body, a blast treatment or the like may be applied. On the other hand, in order to increase the degree of cleaning, cleaning treatment such as pure water cleaning, hot water cleaning, ultrasonic cleaning or the like may be achieved after the anodizing treatment, the coloring treatment and the sealing treatment.

The shape of the pellicle frame 2 is not particularly limited as long as the effects of the present invention are not impaired and can be various conventionally known shapes according to the shape of the exposure master plate (mask or reticle) 8, but, in general, the plane shape of the pellicle frame 2 is a ring shape, a rectangular shape or a square shape and has a size and shape to cover the circuit pattern portion provided on the exposure master plate (mask or reticle) 8. In addition, the pellicle frame 2 may be provided with an air pressure adjustment vent (not shown), a dust removal filter (not shown) for the vent, jig holes (not shown), and the like.

The height (thickness) of the pellicle frame 2 is preferably 1 to 10 mm, more preferably 2 to 7 mm, and most preferably 3 to 6 mm. By setting the height (thickness) of the pellicle frame 2 to these values, the deformation of the pellicle frame 2 can be inhibited, and good handling property can be ensured.

The cross-sectional shape of the pellicle frame 2 is not particularly limited as long as the effects of the present invention are not impaired and can be various conventionally known shapes, but it is preferable that the cross-sectional shape is a quadrilateral in which the upper side and the lower side are parallel. There are required a width for affixing the pellicle film 6 is required on the upper side of the pellicle frame 2, and a width for adhering to the exposure master plate 8 by providing the adhesive layer 10 for pressure sensitive adhesion on the lower side. For this reason, the width of the upper side and the lower side of the pellicle frame 2 is preferably about 1 to 3 mm.

The flatness of the pellicle frame 2 is preferably smaller than or equal to 20 μm, more preferably smaller than or equal to 10 μm. By improving the flatness of the pellicle frame 2, it is possible to reduce the deformation amount of the pellicle frame 2 when the pellicle 1 is attached to the exposure master plate (mask or reticle) 8. The flatness of the pellicle frame 2 is calculated by calculating a virtual plane by measuring the height at a total of 8 points including 4 corners of the pellicle frame 2 and 4 central points of the four sides, and then calculating from the difference obtained by subtracting the lowest point from the highest point among the distances of each point.

2. Method for Manufacturing Pellicle Frame

The method for manufacturing a pellicle frame of the present invention is a method for manufacturing a pellicle frame, comprising: a first step for obtaining an aluminum alloy plastic worked (aluminum alloy to be plastic-worked) by subjecting an aluminum alloy ingot which contains 5.0 to 10.0% by weight of Ca with the remainder aluminum and inevitable impurities, and has a volume ratio of an $Al_4Ca$ phase which is a dispersed phase of 25% or more to a plastic working, a second step for subjecting the aluminum alloy plastic worked to a heat treatment in a temperature range of 100 to 300° C., and a third step for subjecting the heat-treated aluminum alloy plastic worked to an anodizing treatment with an alkaline electrolytic solution containing an alkali metal and/or an alkaline earth metal as an electrolyte, or an alkaline electrolytic solution containing at least one organic acid selected from maleic acid, oxalic acid, salicylic acid and citric acid.

The Young's modulus of the Al—Ca alloy varies depending on the amount of the $Al_4Ca$ phase and the crystal structure. Therefore, even if the amount of the $Al_4Ca$ phase is the same, the crystal structure is changed by the plastic working in the first step, and the Young's modulus may be increased in some cases. On the other hand, by achieving a heat treatment (annealing treatment) in the temperature range of 100 to 300° C. after the plastic working, it is possible to return the crystal structure of the $Al_4Ca$ phase to the state before the plastic working and to lower the Young's modulus.

Further, by setting the V content of the aluminum alloy ingot to 0.0001 to 0.005% by weight, it is possible to inhibit the formation of a compound of 30 μm or more by reaction with V and Ca, Ti, Al, or the like. As a result, formation of the white spot defects after the anodizing treatment (third step) can be inhibited.

Furthermore, by setting the Fe content to 0.05 to 1.0% by weight, it is possible to make the cast structure of the Al—Ca alloy coarse and uniform. As a result, the fine eutectic structure emphasized after the anodizing treatment (third step) can be blurred, and the formation of the black defects can be inhibited.

Further, before the first step, it is preferable to subject the aluminum alloy ingot to a heat treatment at a temperature of higher than or equal to 400° C. By holding at a temperature of higher than or equal to 400° C. (homogenizing treatment) prior to plastic working, the eutectic structure can be made coarse and uniform. As a result, as described above, the fine eutectic structure can be blurred, and the formation of the black spot defects can be inhibited.

It is preferable that, after the third step, a secondary electrolytic coloring is further achieved with an electrolytic solution containing a metal salt. For example, the secondary electrolysis with an electrolytic coloring solution containing a Ni salt, a Ni+Sn salt or the like makes it possible to further advance blackening and also to reduce white spot and black spot defects.

The representative embodiments of the present invention have been described above, but the present invention is not limited only to these embodiments, and various design changes are possible, and all such design changes are included in the technical scope of the present invention.

EXAMPLES

Example

An aluminum alloy having the composition (% by weight) shown in Sample 1 of Table 1 was cast into an ingot of φ8 inches (billet) by a DC casting method and homogenized at 550° C. for 4 hours, and then, plastic-worked at an extrusion temperature of 500° C. to obtain a plate having a width of 180 mm×a thickness of 8 mm. Thereafter, after cold rolling to a thickness of 3.5 mm, a heat treatment was carried out to hold at 200° C. for 4 hours to obtain the present aluminum alloy plastic worked.

The thus obtained present aluminum alloy plastic worked was machined to produce an aluminum frame in the shape of frame having an external size of 149 mm×122 mm×a thickness 3 mm. After subjecting the obtained aluminum frame material to a shot blasting treatment by using stainless steel grains having an average grain size of about 100 μm, the blast-treated aluminum frame material was subjected to the anodizing treatment by using an alkaline aqueous solution (pH=13.7) as an electrolytic solution in which 8 g/L of sodium hydroxide were dissolved, at a bath temperature of 5° C. under a constant voltage electrolysis of an electrolytic voltage of 40 V for 20 minutes. Then, after washing with pure water, by measuring a thickness if the anodized film formed on the surface of the aluminum frame material with an eddy current type film thickness meter (available from Fischer Instruments Co., Ltd.), the thickness was 6.6 μm.

Subsequently, the aluminum frame material was placed in a steam sealing apparatus and was subjected to a sealing treatment for 30 minutes while generating steam at a relative humidity of 100% (R.H.), 2.0 kg/cm$^2$G at a temperature of 130° C. to obtain the present pellicle frame.

FIG. 3 shows the X-ray diffraction pattern of the present aluminum alloy plastic worked. In the X-ray diffraction measurement, a specimen of 20 mm×20 mm was cut out from the present plate-like aluminum alloy plastic worked, the surface layer portion was scraped by about 500 μm, and then a θ-2θ measurement was carried out with respect to the region from a Cu-Kα beam source. From the peak position of the $Al_4Ca$ phase in FIG. 3, it can be seen that the tetragonal $Al_4Ca$ phase and the monoclinic $Al_4Ca$ phase are mixed in the present aluminum alloy plastic worked.

The result of the structure observation (optical microscopic photograph) on the cross section of the present pellicle frame is shown in FIG. 4. The black region was the $Al_4Ca$ phase, and the area (volume) ratio of the $Al_4Ca$ phase was measured by an image analysis and was 36.8%.

The present pellicle frame was cut into a test piece, and a tensile strength was measured by a tensile test, and a yield strength and a Young's modulus were measured. The obtained results are shown in Table 2. In addition, the present pellicle frame was cut and aligned to form a 30×30 mm surface, and the lightness index L* value was measured using a CR-400 available from KONICA MINOLTA CORPORATION using a Hunter's color difference formula of the pellicle frame of the example. The results are shown in Table 2.

Comparative Example 1

A comparative pellicle frame 1 having an anodized film having a film thickness of 7.1 μm was prepared in the same manner as in Example 1 except that the composition (% by weight) shown in Sample 2 in Table 1 was used. A tensile strength, a yield strength, a Young's modulus and an L* value of the comparative pellicle frame 1 were measured in the same manner as in the above example. The obtained results are shown in Table 2.

Further, in the same manner as in the above example, the structure observation on the cross section of the comparative pellicle frame 1 was carried out, and an area (volume) rate of the $Al_4Ca$ phase was measured by an image analysis and found to be 15.9%.

Comparative Example 2

A comparative pellicle frame 2 having an anodized film with a film thickness of 6.6 μm was prepared by anodizing in the same manner as in the above example except that 53 g/L of sodium tartrate was added as the electrolytic solution for anodizing treatment. A tensile strength, a yield strength, a Young's modulus and an L* value of the comparative pellicle frame 2 were measured in the same manner as in the above example. The obtained results are shown in Table 2.

TABLE 1

|  | Ca | V | Fe | Al |
| --- | --- | --- | --- | --- |
| Sample 1 | 7.44 | 0.001 | 0.05 | Bal. |
| Sample 2 | 2.53 | 0.001 | 0.06 | Bal. |

TABLE 2

|  | Tensile strength (MPa) | Yield strength (MPa) | Young's modulus (GPa) | L* value |
| --- | --- | --- | --- | --- |
| Example | 224 | 171 | 50.2 | 40.6 |
| Com. Example 1 | 185 | 161 | 62.5 | 54.2 |
| Com. Example 2 | 224 | 171 | 50.2 | 78.8 |

The Young's modulus of the pellicle frame produced from the 7.44% by weight Ca alloy in the example is 50.2 GPa, which is much smaller than that of the Comparative example 1 (62.5 GPa). Here, the Young's modulus of Comparative Example 2 also shows a small value of 50.2 GPa, but the L* value is as large as 78.8.

FIG. 5 and FIG. 6 show SEM photographs (apparatus used: ULTRA PLUS available from ZEISS) of the cross section of the present pellicle frame and the Comparative pellicle frame 2, respectively. In the present pellicle frame, the $Al_4Ca$ phase remains in the anodized film, whereas in the Comparative pellicle frame 2, the $Al_4Ca$ phase is removed from the anodized film due to dissolution, which results in a porous state. From the observation result, it is considered that the L* value increased due to removal of the $Al_4Ca$ phase in the Comparative pellicle frame 2.

EXPLANATION OF SYMBOLS

1: Pellicle
2: Pellicle frame
4: Adhesive layer for affixing the pellicle film
6: Pellicle film
8: Exposure master plate (mask or reticle)
10: Pressure sensitive adhesion layer

The invention claimed is:

1. A pellicle frame with an anodized film on a surface of an aluminum alloy frame, characterized in that:
the aluminum alloy frame comprises an aluminum alloy which contains Ca: 5.0 to 10.0% by weight with the remainder aluminum and unavoidable impurities are contained, and has an area (volume) ratio of an $Al_4Ca$ phase, which is a dispersed phase, is greater than or equal to 25%, and a crystal structure of a part of the $Al_4Ca$ phase is monoclinic; wherein
the anodized film has $Al_4Ca$ particles.

2. The pellicle frame according to claim 1, wherein a V content and a Fe content of the aluminum alloy are 0.0001 to 0.005% by weight and 0.05 to 1.0% by weight, respectively.

3. The pellicle frame according to claim 1, wherein an average crystal grain size of the $Al_4Ca$ phase is 1.5 μm or less.

4. A method for manufacturing a pellicle frame, comprising:
a first step for obtaining an aluminum alloy plastic worked by subjecting an aluminum alloy ingot which contains 5.0 to 10.0% by weight of Ca with the remainder aluminum and inevitable impurities, and has a volume ratio of an $Al_4Ca$ phase which is a dispersed phase of 25% or more to a plastic working,
a second step for subjecting the aluminum alloy plastic worked to a heat treatment in a temperature range of 100 to 300° C., and
a third step for subjecting the heat-treated aluminum alloy plastic worked to an anodizing treatment with an alkaline electrolytic solution containing an alkali metal and/or an alkaline earth metal as an electrolyte, or an alkaline electrolytic solution containing at least one organic acid selected from maleic acid, oxalic acid, salicylic acid and citric acid.

5. The method for manufacturing a pellicle frame according to claim 4, wherein a V content and a Fe content of the aluminum alloy are 0.0001 to 0.005% by weight and 0.05 to 1.0% by weight, respectively.

6. The method for manufacturing a pellicle frame according to claim 5, wherein, before the first step, the aluminum alloy ingot is subjected to a heat treatment where the ingot is maintained at a temperature of 400° C. or more.

7. The method for manufacturing a pellicle frame according to claim 4, wherein, after the third step, a secondary electrolytic coloring is further achieved with an electrolytic solution containing a metal salt.

8. A pellicle comprising the pellicle frame according to claim 1 and a pellicle film supported by the pellicle frame.

* * * * *